US007554348B2

(12) United States Patent
Brandorff

(10) Patent No.: US 7,554,348 B2
(45) Date of Patent: Jun. 30, 2009

(54) MULTI-OFFSET DIE HEAD

(75) Inventor: Alexander Brandorff, New Milford, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 0 days.

(21) Appl. No.: 11/770,896

(22) Filed: Jun. 29, 2007

(65) Prior Publication Data

US 2009/0002009 A1    Jan. 1, 2009

(51) Int. Cl.
*G01R 31/02* (2006.01)
(52) U.S. Cl. ............... 324/754; 324/758; 324/158.1
(58) Field of Classification Search ......... 324/754–765, 324/158.1
See application file for complete search history.

(56) References Cited

U.S. PATENT DOCUMENTS

| | | | | |
|---|---|---|---|---|
| 5,534,784 | A | * | 7/1996 | Lum et al. .................... 324/757 |
| 5,952,843 | A | * | 9/1999 | Vinh ........................... 324/761 |
| 5,977,787 | A | * | 11/1999 | Das et al. .................... 324/761 |
| 6,163,162 | A | | 12/2000 | Thiessen et al. |
| 6,297,657 | B1 | | 10/2001 | Thiessen et al. |
| 6,566,898 | B2 | | 5/2003 | Evans et al. |
| 6,633,175 | B1 | | 10/2003 | Evans et al. |
| 6,853,208 | B2 | * | 2/2005 | Okubo et al. ................ 324/758 |
| 6,927,586 | B2 | | 8/2005 | Thiessen et al. |
| 6,977,515 | B2 | | 12/2005 | McQuade et al. |
| 7,180,318 | B1 | * | 2/2007 | Mahoney et al. ............ 324/761 |
| 7,282,936 | B2 | * | 10/2007 | Brandorff ..................... 324/758 |
| 7,417,447 | B2 | * | 8/2008 | Kister ......................... 324/754 |
| 2005/0110510 | A1 | * | 5/2005 | Brandorff ..................... 324/758 |
| 2005/0218429 | A1 | | 10/2005 | Mazza et al. |
| 2006/0066328 | A1 | | 3/2006 | Clegg et al. |

OTHER PUBLICATIONS

International Application No. PCT/US2008/068296, "International Search Report and Written Opinion," sent Dec. 1, 2008.

* cited by examiner

*Primary Examiner*—Ha Tran T Nguyen
*Assistant Examiner*—Richard Isla Rodas
(74) *Attorney, Agent, or Firm*—Wiggin and Dana LLP; Anthony P. Gangemi

(57) ABSTRACT

An upper die portion of a die head for aligning probes having different offsets in a first array of first micro-holes formed in a lower die portion of the die head. The upper die portion includes a spacer portion and a first assembly aid film. The spacer portion includes first and second surfaces. The first surface contacts the lower die portion. The first assembly aid film is attached with the second surface and has a second array of second micro-holes for receiving the probes having different offsets. The second micro-holes include at least a first micro-hole that is configured to be offset from a corresponding micro-hole of the first micro-holes by a first offset and at least a second micro-hole that is configured to be offset from a corresponding micro-hole of the first micro-holes by a second offset that is not the same as the first offset.

17 Claims, 3 Drawing Sheets

MULTI-OFFSET DIE HEAD

BACKGROUND

1. Field

The disclosed subject matter relates to a vertical pin integrated circuit probing device, and more particularly to a multi-offset die head for loading probes having different offsets into a die head assembly of the vertical pin integrated circuit probing device.

2. Description of the Related Art

One of the challenges of vertical buckling beam (VBB) probe technology is the ability to probe very tight pitch peripheral pads. This has conventionally been done with cantilever-style probe cards. A cantilever card consists of rows of wires suspended substantially horizontally over the device to be tested. The tips of the wires are bent down, and are tapered down to a point which contacts the pads on the chip. The tight pitch requires having multiple layers of overlapping probes. Since the tips are free-floating, their location must be fine-adjusted by manually bending the wire such that the probe tip aligns with the center of the pad being tested. Periodic re-adjustment of the tips is necessary, creating a maintenance issue for the user. The overlapping nature of the design also requires long probe needles which results in increased probe inductance and limits the number of chips that can be probed simultaneously.

One difficulty with using VBB probes for tight pitch peripheral bond pad applications is the difficulty in making a reliable contact between the head of the probe and the space transformer pad. This is not an issue with cantilever cards because the base of the cantilever contact is soldered directly to the PCB. In contrast, the heads of VBB probes float inside micro-holes that are drilled into the probe head upper die. These upper die micro-holes are normally over-sized relative to the holes in the lower die to facilitate assembly of the upper die over the heads of all the contacts simultaneously. The contact heads and the space transformer pads may not be perfectly aligned due to the oversized upper die holes, potential misalignment between the upper die with the space transormer, differences in thermal expansion of the head and space transformer, head scrub, etc. It is therefore desirable to have as large a pad as possible to accomodate any misalignment.

Larger pads can sometimes be accommodated in tight-pitch in-line pad arrangements by "spinning" the contacts. By rotating the contacts slightly, it is possible to move the heads of neighboring probes further apart, allowing for the use of larger space transformer pads. However, for in-line arrangements where there are long continuous rows of pads without gaps, this is often not possible. In a peripheral pad arrangement, the pads on the chip are generally very narrow and rectangular in shape and it is desirable to align the contact such that the contact "scrubs" along the long direction of the pad. Since this precludes "spinning" the contacts, the heads of the VBB probes end up aligned at the same pitch as the pads on the chip being tested. The tight pitch of these peripheral bond pads prevents the use of oversized pads. In addition, because the pitch is so tight, over sizing the upper die holes would not be possible with a conventional VBB probe design, thereby making the assembly process very difficult. U.S. Pat. Nos. 6,297,657 and 6,633,175 disclose vertical pin probing devices and are incorporated by reference as if fully disclosed in their entireties herein.

SUMMARY

One aspect of the disclosed subject matter is an upper die portion of a die head for aligning probes having different offsets in a first array of first micro-holes formed in a lower die portion of the die head. The upper die portion includes a spacer portion including first and second surfaces, the first surface for contacting the lower die portion; and a first assembly aid film attached with the second surface and having a second array of second micro-holes for receiving the probes having different offsets, wherein the second micro-holes include at least a first micro-hole that is configured to be offset from a corresponding micro-hole of the first micro-holes by a first offset and at least a second micro-hole that is configured to be offset from a corresponding micro-hole of the first micro-holes by a second offset that is not the same as the first offset.

Another aspect of the disclosed subject matter is a die head including alignment mechanisms for aligning probes having different offsets in the die head. The die head includes a lower die portion having multiple surfaces, at least one of said multiple surfaces having a first array of first micro-holes for receiving the probes; and an upper die portion having a spacer portion, a first assembly aid film, a support frame positioned adjacent said first assembly aid film, and an upper die plate joined with said support frame and having a third array of third micro-holes for receiving the probes, wherein said third array of third micro-holes are patterned to align with said second array of second micro-holes, said spacer portion including first and second surfaces, said first surface in contact with at least one of said multiple surfaces of said lower die portion, said first assembly aid film attached with said second surface, said first assembly aid film having a second array of second micro-holes for receiving the probes having different offsets, wherein said second micro-holes include at least a first micro-hole that is configured to be offset from a corresponding micro-hole of said first micro-holes by a first offset and at least a second micro-hole that is configured to be offset from a corresponding micro-hole of said first micro-holes by a second offset that is not the same as said first offset.

Still another aspect of the disclosed subject matter is a die head including alignment mechanisms for aligning probes having different offsets with over-sized space transformer pads. The die head includes a lower die portion having multiple surfaces, at least one of said multiple surfaces having a first array of first micro-holes for receiving probes; and an upper die portion having a spacer portion and a first assembly aid film, said spacer portion including first and second surfaces, said first surface in contact with at least one of said multiple surfaces of said lower die portion, said first assembly aid film attached with said second surface, said first assembly aid film having a second array of second micro-holes that are configured to be in alignment with the pads of the space transformer.

BRIEF DESCRIPTION OF THE DRAWINGS

For the purpose of illustrating the invention, the drawings show a form of the disclosed subject matter that is presently preferred. However, it should be understood that the disclosed subject matter is not limited to the precise arrangements and instrumentalities shown in the drawings, wherein.

DETAILED DESCRIPTION

Figure 1:
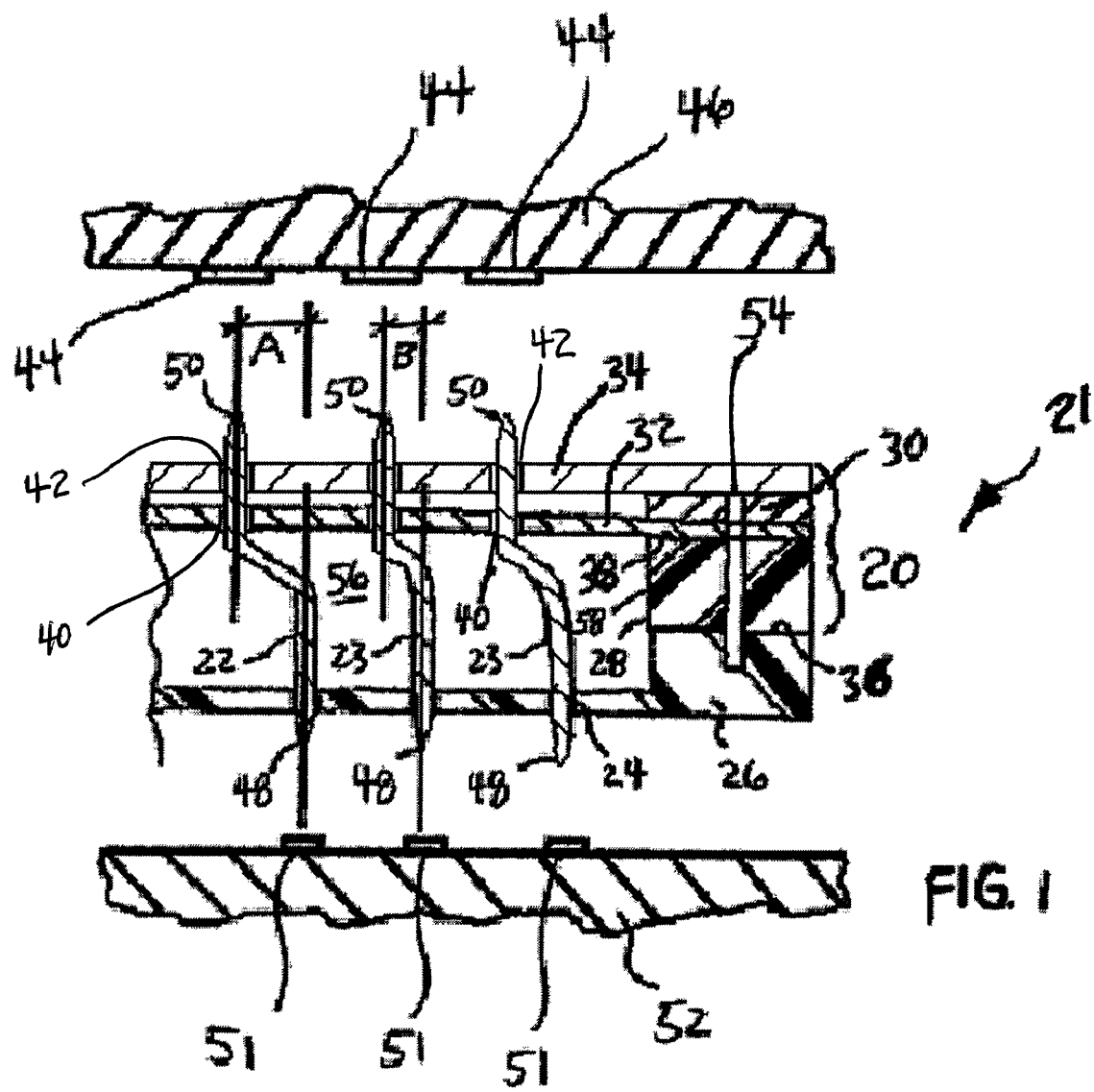
FIG. 1 is a partial cross-section of a multi-offset die head according to one embodiment of the disclosed subject matter.

Referring now to FIG. 1, in which like reference numerals indicate like parts, one embodiment of the disclosed subject matter includes an upper die portion 20 of a die head 21 for aligning probes 22 and 23, which have different offsets, e.g., the horizontal dimension from a probe head to a probe tip, in a first array of first micro-holes 24 formed in a lower die portion 26 of the die head. Upper die portion 20 generally, but not always, includes a spacer portion 28, a support frame 30, a first assembly aid film 32, and an upper die plate 34.

Spacer portion 28 includes first and second surfaces 36 and 38, respectively. First surface 36 is adapted to contact lower die portion 26. Second surface 38 is typically, but not always, joined with first assembly aid film 32. Spacer portion 28 is typically an annular configuration having a square or rectangular cross-section and may be formed from any materials known to be suitable as a die portion, e.g., a fiber-filled epoxy, a low expansion metal, or a ceramic.

Support frame 30 and other portions of upper die portion 20 are typically formed from a plastic insulating material such as those sold under the brand name Delrin®, an acetal resin that is a registered trademark E.I. duPont de Nemours & Co of Wilmington, Del., a low expansion metal such as those sold under the brand name Invar®, a nickel alloy that is a registered trademark of Imphy, S.A., a ceramic such as silicon nitride, or a polyimide material such as those sold under the brand name Cirlex®. Support frame 30 is typically similar in shape to spacer 28 but with a smaller dimension with respect to the longitude of each of probes 22 and 23.

First assembly aid film 32 is typically positioned between second surface 38 and support frame 30 and includes a second array of second micro-holes 40 adapted to receive probes 22 and 23, which have different offsets. Upper die plate 34 generally is in close proximity to first assembly aid film 32 and has a third array of third micro-holes 42 adapted to receive probes 22 and 23. Upper die plate 34 is typically, but not always, joined with support frame 30. Upper die plate 34 is generally fabricated from a semi-rigid material having a thickness of 4-8 mils.

Second array of second micro-holes 40 and third array of third micro-holes 42 are patterned to align with one another but at an offset from first array of first micro-holes 24. The offset of each corresponding pair of micro-holes between first array 24 and second array 40 and first array 24 and third arrays 42 may vary, e.g., an offset A and an offset B, to ensure the second and third arrays are in alignment with pads 44 of a space transformer 46. The amount of offset A and offset B, which is the lateral distance between a probe tip 48 and a probe head 50 of each of the probes, is determined by the position and size of each of pads 44 on space transformer 46, i.e., the lateral distance between the center of adjacent pads. Each probe head 50 is configured to contact a corresponding pad 44 and each probe tip 48 is configured to contact a contact pad 51 of an integrated circuit 52 under test.

Each of the micro-holes in third array of third micro-holes 42 of upper die plate 34 are generally over-sized, e.g., typically having a diameter approximately 0.5 mil (0.0005 inch) larger than the diameter of probes 22 and 23, which is smaller than the micro-holes in the upper die of the prior art. Each of the micro-holes in second array of second micro-holes 42 of first assembly aid film 32 are generally smaller than the micro-holes in upper die plate 34, e.g., typically having a diameter about 0.1 mil (0.0001 inch) larger than the diameter of each of probes 22 and 23 so that the probes can be held in close relative alignment to each other and that each of the second micro-holes is effectively sealed to prevent debris from entering the die head.

Upper die portion 20 may also include alignment holes 54, which are intended to engage a dowel or similar structure (not shown) for aligning the components of upper die portion 20 with lower die 22. Additional structural rigidity may be provided to upper die portion 20 by bonding first assembly aid film 32 to spacer portion 28 and or support frame 30 using commercially available adhesives, e.g., 3M 2290 Structural Adhesive (3M, St. Paul, Minn.) or similar.

First assembly aid film 32 may be any suitable polymer film, e.g., of the type formed from a polyimide, and is typically at least semi-transparent. First assembly aid film 32 generally creates a taut "drum skin" across an aperture 56 that includes a perimeter 58, which is defined within the die head spacer portion 28, thereby eliminating the non-flatness problem inherent in conventional designs. In alternative embodiments, an additional assembly aid film (not shown) can be included and positioned to float on top of first assembly aid film 32.

Figure 2:
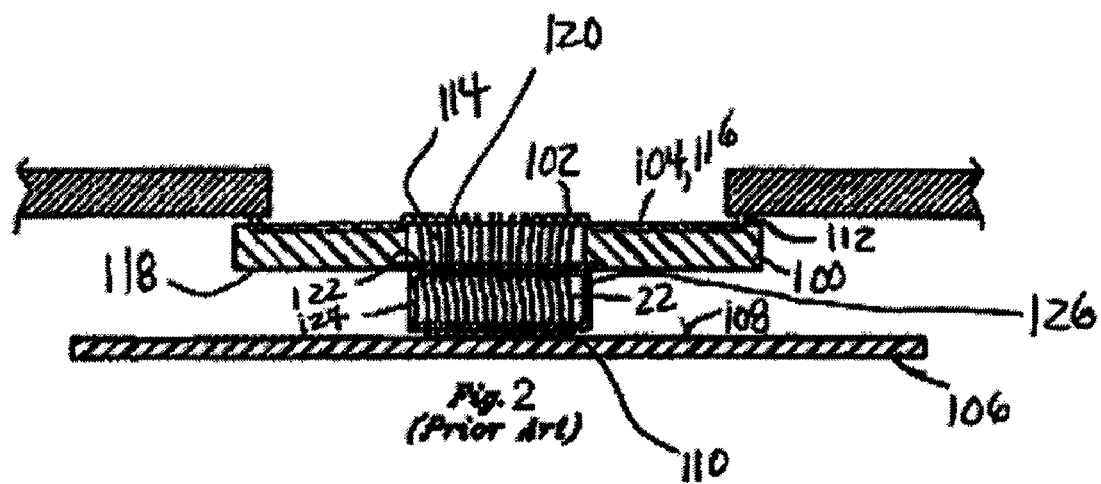
FIG. 2 is a partial cross-section of a die head known in the prior art.
Figure 3:
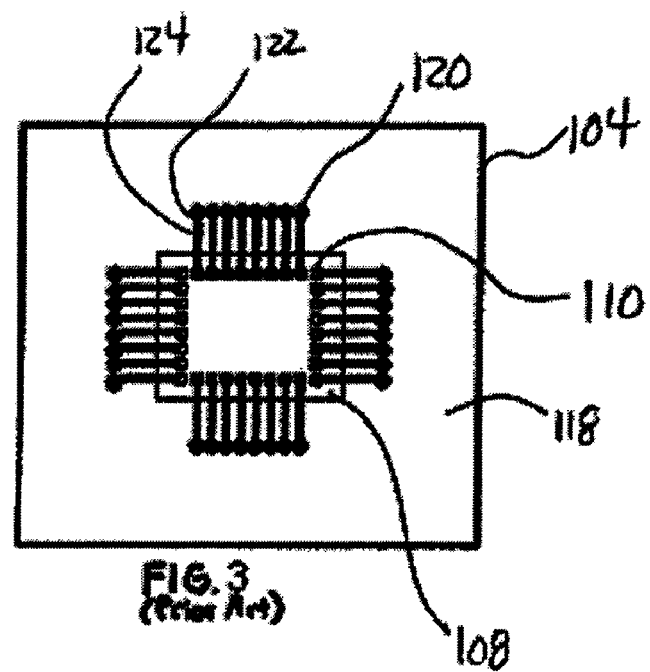
FIG. 3 is a schematic bottom view of probes connected to contact pads on an integrated circuit and contact pads on a space transformer, according to embodiments in the prior art.

Referring now to FIGS. 2 and 3, a common type of prior art space transformer 100 includes a wired interface 102 used together with an etched "dedicated" printed circuit board 104. In use, a silicon wafer 106 includes a number of integrated circuit devices 108 thereon with contact pads 110 to be probed. Multiple power, ground, and signal potentials are supplied from test equipment through connectors 112 to pogo pads (not shown) on the outer periphery of printed circuit board 104. A particular pattern of test circuit dedicated to a particular pattern of contact pads 110 on integrated circuit device 108 is provided by traces etched into or deposited on printed circuit board 104. A set of wire leads 114, which are connected to etched traces 116 terminate on an underside 118 of printed circuit board 104, e.g., with or without corresponding contact pads 120, so as to make contact with heads 122 of probes 124 held in an upper die head 126. As best illustrated in FIG. 3, corresponding contact pads 120 are typically positioned in close proximity to one another thereby limiting the size of each of the pads.

Figure 4:
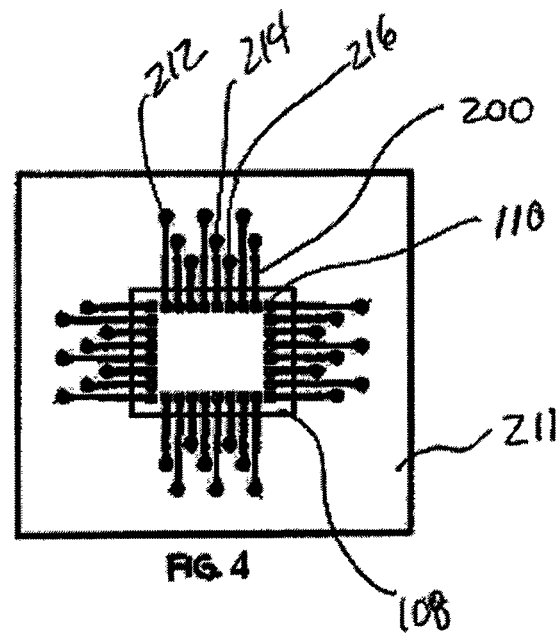
FIG. 4 is a schematic bottom view of probes connected to contact pads on an integrated circuit and contact pads on a space transformer, according to embodiments of the disclosed subject matter.
Figure 5:
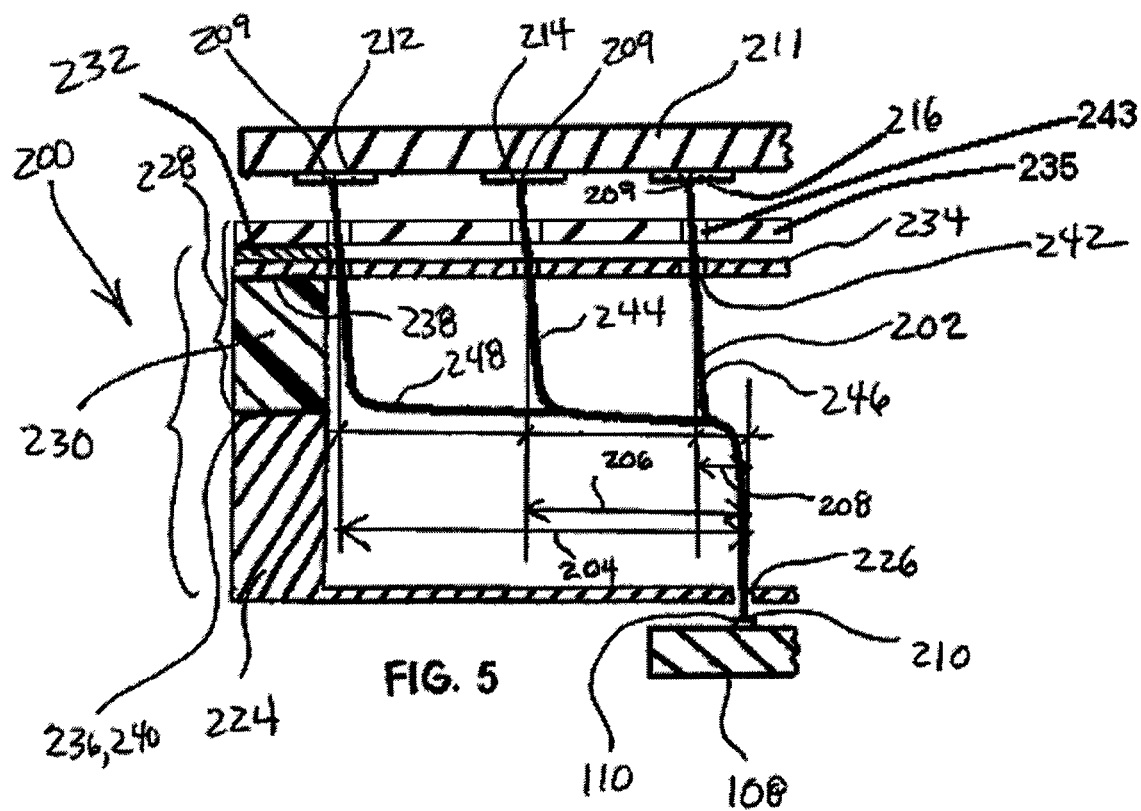
FIG. 5 is a partial cross-section of a die head according to embodiments of the disclosed subject matter.

Referring now to FIGS. 4 and 5, another aspect of the disclosed subject matter is a die head 200 including alignment mechanisms for aligning probes 202 having different offsets 204, 206, 208, i.e., the lateral distance between heads 209 and tips 210 of each of the probes, with a space transformer 211 having over-sized pads 212, 214, 216. Similar to the embodiment described in FIG. 1, a lower die portion 224 has multiple surfaces with at least one of the multiple surfaces having a first array of first micro-holes 226 for receiving probes 202. An upper die portion 228 includes a spacer portion 230, a support frame 232, a first assembly aid film 234, and an upper die plate 235. Spacer portion 230 includes first and second surfaces 236 and 238. First surface 236 is in contact with at least one of the multiple surfaces, e.g., a surface 240, of lower die portion 224. First assembly aid film 234 is attached with second surface 238. First assembly aid film 234 has a second array of second micro-holes 242 that are configured to be in alignment with offset pads 212, 214, 216 of space transformer 211. Upper die plate 235 has a third array of third micro-holes 243 that are configured to be in alignment with second array 242.

Still referring to FIG. 5, for example, a standard one of probes 202, e.g., probe 244, might have an offset of 48 mils. By manufacturing probes 246 and 248 of 40 mils and 56 mils offset, respectively, in addition to a standard offset, and using these in succession on neighboring pads 212, 214, 216, it is possible to have more space between heads 209 of neighboring probes without affecting the pitch at the tips 210 of the probes and without "spinning" the probes.

In one example, with a 4-mil pitch between peripheral pads on an integrated circuit, the distance between probe heads can be increased from 4 mils to 9 mils. This allows for the use of an 8-mil space transformer contact pad rather than a 3-mil contact pad. This would eliminate any chance of the probe head missing or scrubbing off of the pad and greatly simplifies the complexity and cost of manufacturing a space transformer for this application. It makes possible the use of a wired space transformer using 8-mil wire rather than an expensive MLC with 3-mil pads and 1-mil spacing, making for easier assembly, increased current capacity, much lower cost, and shorter lead time.

The disclosed subject matter offers a plurality of benefits and advantages over prior art designs. The disclosed subject matter describes a vertical buckling beam probe card including probes having greater than a single offset. The use of multiple offsets allows for larger pads on the space transformer for a given contact pitch. A larger contact area allows for more area for the head of the probe, minimizing problems associated with head-pad miss-alignment and scrub. It also allows for use of larger wire diameter in wired space transformers, increasing the current capacity of the space transformer and improved ability to align probes with space transformer contact pads for tight pitch applications.

In embodiments according to the disclosed subject matter, alignment of probe heads with contact pads is less critical. The larger contact pads on the space transformer make it less likely that the probe heads will slide off of the contact pads. The larger contact pads help reduce the overall cost and lead time to produce space transformers.

Although the invention has been described and illustrated with respect to exemplary embodiments thereof, it should be understood by those skilled in the art that the foregoing and various other changes, omissions and additions may be made therein and thereto, without parting from the spirit and scope of the disclosed subject matter.

What is claimed is:

1. An upper die portion of a die head for aligning a plurality of probes, at least one of said plurality of probes having a first lateral distance between its tip and head thereby defining a first offset and at least one of said plurality of probes having a second lateral distance between its tip and head that is different from said first lateral distance thereby defining a second offset, in a first array of first micro-holes formed in a lower die portion of the die head, comprising:
   a spacer portion including first and second surfaces, said first surface for contacting the lower die portion; and
   a first assembly aid film attached with said second surface and having a second array of second micro-holes for receiving said plurality of probes, said second micro-holes including at least a first micro-hole that is configured to be offset from a corresponding micro-hole of said first micro-holes by a distance equal to said first offset and at least a second micro-hole that is configured to be offset from a corresponding micro-hole of said first micro-holes by a distance equal to said second offset, wherein a pair of corresponding micro-holes releasably contains different portions of a single one of said plurality of probes.

2. An upper die portion according to claim 1, further comprising:
   a support frame positioned adjacent said first assembly aid film; and
   an upper die plate joined with said support frame and having a third array of third micro-holes for receiving the probes, wherein said third array of third micro-holes are patterned to align with said second array of second micro-holes.

3. An upper die portion according to claim 2, wherein said second and third arrays are configured to be offset from the first array.

4. An upper die portion according to claim 2, wherein said first assembly aid film is at least semi-transparent.

5. An upper die portion according to claim 2, wherein each of the micro-holes of said second array of second micro-holes has a diameter that is selected so that each of the micro-holes of said second array of second micro-holes is substantially sealed when the probes are inserted.

6. An upper die portion according to claim 2, wherein said upper die plate is not fixed to said support frame.

7. An upper die portion according to claim 1, wherein said first assembly aid film is bonded to said support frame.

8. An upper die portion according to claim 2, wherein each of the micro-holes of said second array of second micro-holes has a diameter that is selected so that debris is substantially prevented from passing through said second micro-holes.

9. An upper die portion according to claim 1, wherein said first assembly aid film is at least partially fabricated from a polymer film formed from a polyimide.

10. A die head including alignment mechanisms for aligning probes having different offsets in the die head, comprising:
   a plurality of probes, at least one of said plurality of probes having a first lateral distance between its tip and head thereby defining a first offset and at least one of said plurality of probes having a second lateral distance between its tip and head that is different from said first lateral distance thereby defining a second offset;
   a lower die portion having multiple surfaces, at least one of said multiple surfaces having a first array of first micro-holes for receiving said plurality of probes; and
   an upper die portion having a spacer portion, a first assembly aid film, a support frame positioned adjacent said first assembly aid film, and an upper die plate joined with said support frame and having a third array of third micro-holes for receiving said plurality of probes, wherein said third array of third micro-holes are patterned to align with a second array of second micro-holes, said spacer portion including first and second surfaces, said first surface in contact with at least one of said multiple surfaces of said lower die portion, said first assembly aid film attached with said second surface, said first assembly aid film having a second array of second micro-holes for receiving said plurality of probes, said second micro-holes including at least a first micro-hole that is configured to be offset from a corresponding micro-hole of said first micro-holes by a distance equal to said first offset and at least a second micro-hole that is configured to be offset from a corresponding micro-hole of said first micro-holes by a distance equal to said second offset, wherein a pair of corresponding micro-holes releasably contains different portions of a single one of said plurality of probes.

11. A die head according to claim 10, wherein said second and third arrays are offset from the first array.

12. A die head according to claim 10, wherein said first assembly aid films is at least semi-transparent.

13. A die head according to claim 10, wherein each of the micro-holes of said second array of second micro-holes has a diameter that is selected so that each of the micro-holes of said second array of second micro-holes is substantially sealed when the probes are inserted.

14. A die head according to claim 10, wherein said upper die plate is not fixed to said support frame.

15. A die head according to claim 10, wherein said first assembly aid film is bonded to said support frame.

16. A die head according to claim 10, wherein each of the micro-holes of said second array of second micro-holes has a diameter that is selected so that debris is substantially prevented from passing through said second micro-holes.

17. A die head according to claim 10, wherein said first assembly aid film is at least partially fabricated from a polymer film formed from a polyimide.

* * * * *